United States Patent [19]
Krishnamoorthy

[11] Patent Number: 6,005,240
[45] Date of Patent: Dec. 21, 1999

[54] TRIGGERED RECEIVERS FOR OPTOELECTRONIC-VLSI CIRCUITS

[75] Inventor: Ashok V. Krishnamoorthy, Middletown, N.J.

[73] Assignee: Lucent Technologies Inc., Murray Hill, N.J.

[21] Appl. No.: 09/032,545

[22] Filed: Feb. 26, 1998

Related U.S. Application Data

[60] Provisional application No. 60/056,498, Aug. 20, 1997.

[51] Int. Cl.[6] .................................................. H01J 40/14
[52] U.S. Cl. .............................. 250/214 LA; 250/214 R; 330/59
[58] Field of Search ........................ 250/214 LA, 214 A, 250/214 R; 327/514; 330/308, 59, 310

[56] References Cited

U.S. PATENT DOCUMENTS 5,508,645  4/1996  Castellucci et al. ...................... 327/77

*Primary Examiner*—Que T. Le
*Attorney, Agent, or Firm*—Cohen, Pontani, Lieberman & Pavane

[57] ABSTRACT

A triggered optical receiver includes a single-ended or double-ended detector for detecting the optical signal and responsively transmitting a corresponding electrical signal to a first stage amplifier. The first stage amplifier output is transmitted to a triggered circuit having an input/output voltage hysteresis characteristic for identifying whether the amplified signal is a logic low or high. The hysteresis characteristic minimizes the effect of input noise and supply noise on the output. The width of the hysteresis loop may be selectively controlled to balance the sensitivity of the circuit against its noise tolerance characteristics.

28 Claims, 5 Drawing Sheets

6,005,240

TRIGGERED RECEIVERS FOR OPTOELECTRONIC-VLSI CIRCUITS

RELATED APPLICATIONS

This application claims priority from U.S. Provisional Patent Application Ser. No. 60/056,498 which was filed on Aug. 20, 1997.

BACKGROUND OF THE INVENTION

1. Field of the Invention

The present invention relates to optical receiver circuits which include a triggered inverter stage for use in circuits having a noisy supply voltage. More specifically, the present invention is directed to a triggered receiver circuit that can be used on a dense optoelectronic-VLSI circuit which combines analog optoelectronic I/O devices with high-density digital logic circuits on the same integrated circuit substrate.

2. Description of Related Art

Optical receivers have the task of first converting the analog intensity-modulated optical energy emerging from the end of a fiber or other optical signal carrier into a digital electrical signal, and then amplifying the electrical signal to suitable logic voltage levels for further processing on the integrated circuit chip. To accomplish their functions, optical receivers generally include a photodetector, an amplifier, and signal processing circuitry. Electrical currents generated by the photodetector of the receiver are typically very weak and are therefore adversely affected by random noise on the input signal as well as in the power supply. This is especially true when the optical receiver is mounted close to a digital CMOS circuit which is a significant source of digital noise and crosstalk.

The optical signal experiences many obstacles which may corrupt its original form, such as attenuation and distortion in the optical fiber, photodetector noise in the photodetector and supply noise such as voltage pulses and amplifier noise in the amplifier.

Transimpedance amplifiers, which have a transimpedance feedback element, were developed to provide optical receivers with good sensitivity and dynamic range. A typical input output relationship of a transimpedance amplifier is shown in FIG. 1a, with the vertical portion of the relationship showing the switching threshold. Transimpedance receivers, which include a transimpedance amplifier, are typically biased very close to the switching threshold of the transinpedance amplifier. In a differential two-beam operation, the receiver is actually biased at the midpoint of the switching threshold of the transimpedance amplifier, allowing the receiver to be sensitive to small changes in the input voltage and hence be sensitive to the small amounts of photocurrent (the weak signal) operatively generated by the light detector. The output of the transimpedance amplifier is transmitted to further gain stages which amplify the detector output to low and high logic output levels.

This conventional design is well suited for low-noise systems or for small arrays, but lacks an adequate tolerance to variations in the supply voltage, i.e. supply noise, which may be associated with ground and power lines of high density VLSI circuits due to the simultaneous switching noise, ground bounce and cross-talk from the digital part of the circuit. This noise may be transmitted to the input lines and power supply lines of the receiver and cause the detection of erroneous or spurious signals by the receiver. Since the supply noise is amplified with the weak electrical signal generated by the photodetector, relatively small amounts of input and supply noise can easily corrupt the signal. And inasmuch as the addition of circuitry and related current draws on an already crowded circuit would only add to the problem to be avoided, it would be advantageous to be able to control the deleterious effects of supply noise in the receiver using the least possible amount of additional circuitry and power consumption.

SUMMARY OF THE INVENTION

A circuit for reducing the effects of supply and input noise in a receiver circuit includes a triggered decision stage connected within the circuit immediately following the transimpedance amplifier of the receiver circuit. The triggered decision stage of the receiver circuit comprises a triggered inverter stage that exhibits hysteresis in the input/output voltage relationship, such as a Schmitt trigger. The hysteresis characteristic of the triggered inverter increases the tolerance of the receiver circuit to variations in the voltage supply (i.e. supply noise). Although the advantageous increased tolerance to input and supply noise is attended by a decreased sensitivity to changes in the input signal, the decreased sensitivity is controllable as a matter of design choice and selection by altering the length and width of the transistors to thereby adjust the size of the hysteresis loop, and so selectively control the resulting trade-off between sensitivity and increased noise tolerance.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 2:
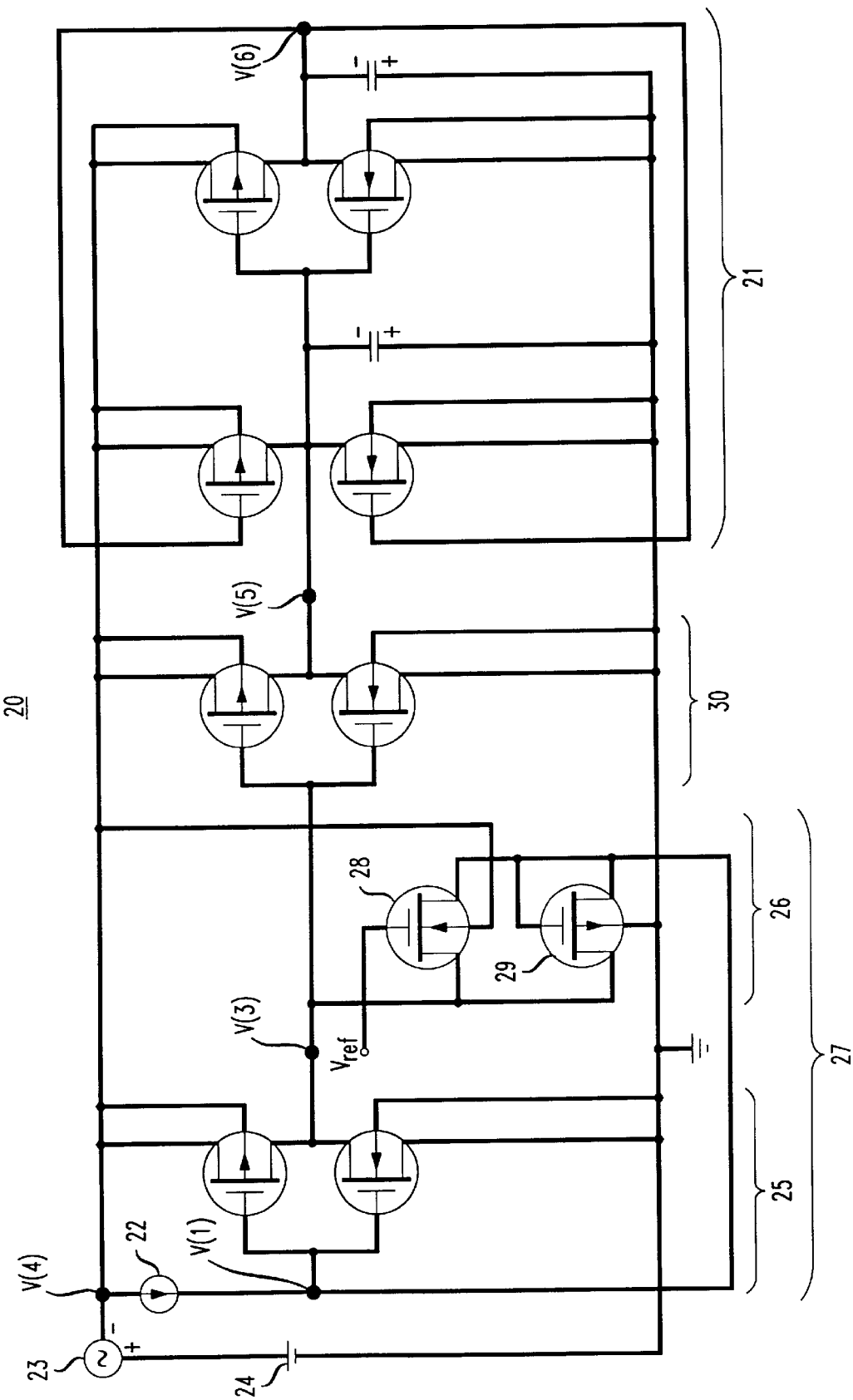
FIG. 2 is a schematic diagram of an embodiment of a triggered-transimpedance receiver in accordance with the present invention.

With initial reference to FIG. 2, a single-ended (one beam) triggered transimpedance receiver 20 includes a photodetector 22. The photodetector 22 in this embodiment is a GaAs pin photodiode. More specifically, the diode may be a GaAs Multiple Quantum Well (MQW) photodiode. However, other types of photodetectors, such as a Metal-Semiconductor-Metal photodetector, which likewise provide a variable electrical output in response to a variable light intensity input may also be used. A supply voltage 24 is applied across the photodetector 22. A supply noise voltage 23 resulting from unintended variation in the supply voltage 24 is represented as a voltage generator connected between the supply voltage 24 and photodetector 22. Since the intended supply voltage 24 is constant, the voltage applied across the photodetector 22 varies by an amount equal to the amplitude of the noise voltage 23.

The voltage across photodetector 22 varies in response to variations in a light signal applied to or incident on the photodetectors, and the voltage v(1) at the photodetector 22 correspondingly varies in response to a change in the voltage across the photodetector 22. Put in another way, voltage v(1) varies in response to the light signal.

A transimpedance amplifier 27 comprises a first stage amplification circuit 25 and a transimpedance feedback stage 26. The first stage amplification circuit 25 receives voltage v(1) as an input signal and is powered by a voltage v(4). The voltage v(1), which electronically represents the variable light signal, is then amplified and output as voltage v(3). Output voltage v(3) is also connected to the input voltage v(1) of the first stage amplification circuit 25 through the transimpedance feedback stage 26 which comprises an n-channel metal oxide semiconductor (NMOS) 28 and a p-channel metal oxide semiconductor (PMOS) 29 in a parallel arrangement that is used as a feedback resistance to the first stage amplifier circuit 25. The purpose of the transimpedance feedback stage 26 is to bias the first stage amplifier 25 at the switching threshold and add stability to the output of the first stage amplifier circuit 25. The use of the NMOS 28 and PMOS 29 elements, in lieu of actual conventional passive linear resistors, improves the ability of the circuit to quickly adjust between high and low output voltages.

Figure 1A:
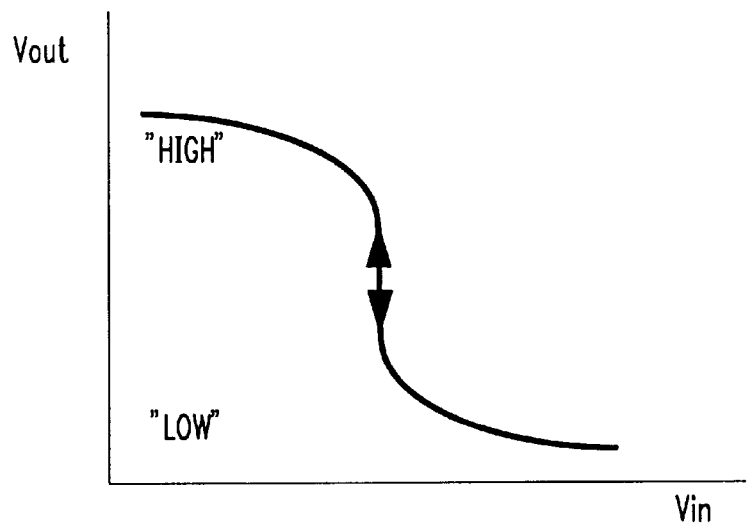
FIG. 1a graphically depicts the characteristic input-output relationship for a prior art receiver unit.
Figure 1B:
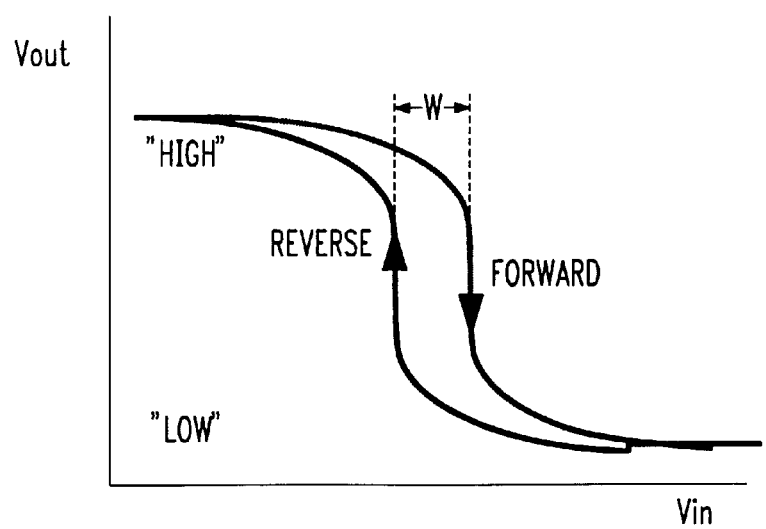
FIG. 1b graphically depicts the characteristic input-output relationship for the receiver of the present invention.

The output v(3) of the transimpedance amplifier 27 is input to a second stage amplifier 30 that amplifies the voltage v(3) to voltage levels which are recognizable by further circuitry as logic "1" or logic "0". The second stage amplifier 30 generates an output voltage v(5) that is electrically connected as an input signal to a triggered circuit 21. Triggered circuit 21 is the decision stage of the receiver 20 which operatively determines whether its input is a high signal or a low signal. Thus, the output voltage v(6) of triggered circuit 21 is either a high or a low signal, based on the input voltage to the circuit 21. The triggered circuit exhibits a hysteresis characteristic, a typical example of which is shown in FIG. 1b. In such a hysteresis loop, the input voltage at which the output voltage v(6) changes between the high and low states or levels, as the input voltage increases, is different than the triggered circuit input voltage at which the output voltage v(6) changes between the low and high levels as the input voltage decreases; the difference between these change-point input voltages is the width w of the hysteresis loop. One consequence of using this design is that the sensitivity of the circuit is typically reduced because of the hysteresis. However, the width w of the hysteresis characteristic or loop can be selectively controlled by a designer of the circuit—the greater the width, the better tolerance to noise and the less sensitive is the circuit. The exact values of the trigger voltages can be chosen by altering the width w to length l ratios of the transistors to balance the sensitivity and noise immunity characteristics in accordance with or to accommodate desired circuit and application requirements.

Figure 4A:
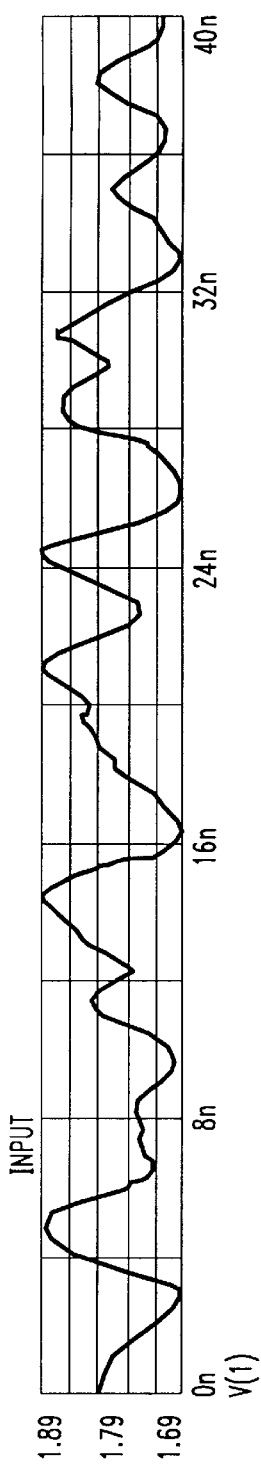
FIGS. 4a–d are a series of graphs showing different voltages from the circuit of FIG. 2 plotted along a timeline.
Figure 4B:
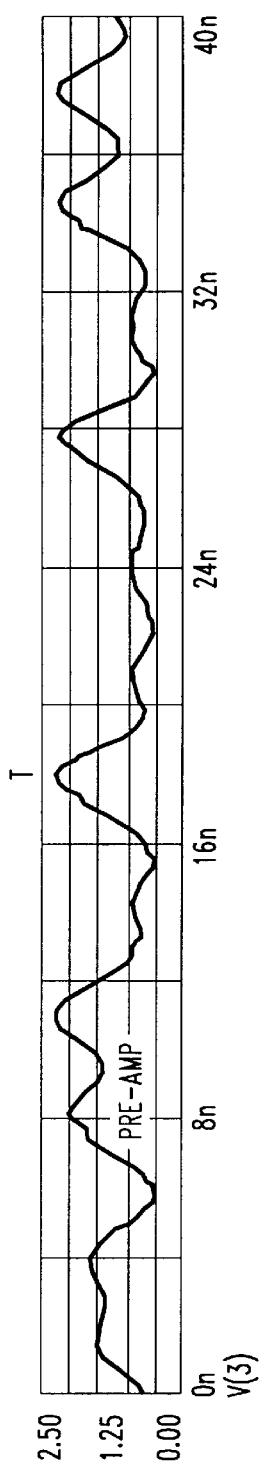
Figure 4C:
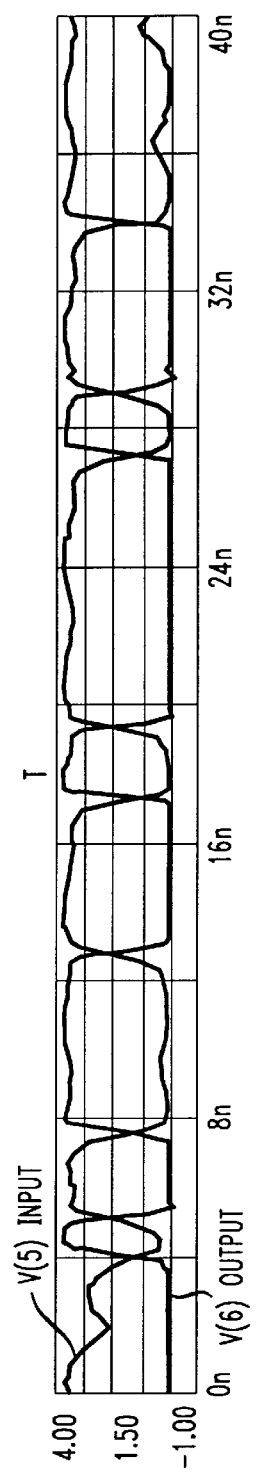
Figure 4D:
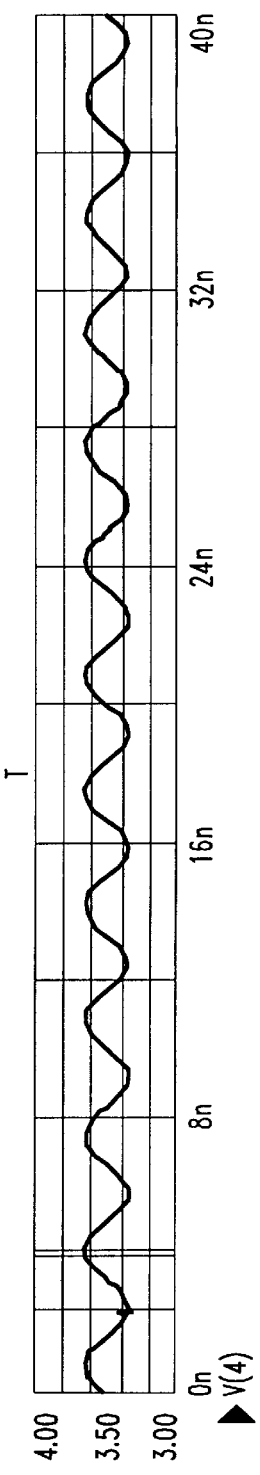

FIGS. 4a–d graphically depicts, as a function of time, data obtained from a simulation of the receiver circuit 30 of FIG. 2. The simulation was performed for a 0.5 μm complementary metal oxide semiconductor (CMOS), 3.3 Volt process, with a circuit operating speed of 311 Mbit/s and a peak current of 20 μm applied to the input. FIG. 4a shows the input voltage v(1) to the transimpedance amplifier 27. Because the noise voltage source 23 is added to the supply voltage applied to the photodetector, the binary data in the signal is barely discernible. FIG. 4b shows the voltage output (v3) from the transimpedance amplifier 27. This voltage v(3) is seen to be more stabilized compared to the input voltage v(1). FIG. 4d, which plots voltage v(4), reveals that the noise from voltage source 23 that is added to the supply voltage 24 has a peak-to-peak voltage swing of approximately 300 mV. The input voltage swing between the high and low band logic states is 200 mV, which is less than the disturbance (i.e. noise voltage 23). Accordingly, the simulation indicates that the circuit may be able to tolerate fluctuations of the supply voltage and/or ground lines that are greater than the input voltage swing. As noted above, the input voltage v(1) appears extremely corrupted because of the noise signal 23. The voltage v(3) (FIG. 4b) still contains some of the disturbances created by the noise voltage 23. However, the triggered inverter stabilizes these disturbances and the inventive circuit's output voltage v(6), as shown in FIG. 4(c), is a logic 1 or 0 as a function of the light signal incident on or applied to photodetector 22.

Figure 3:
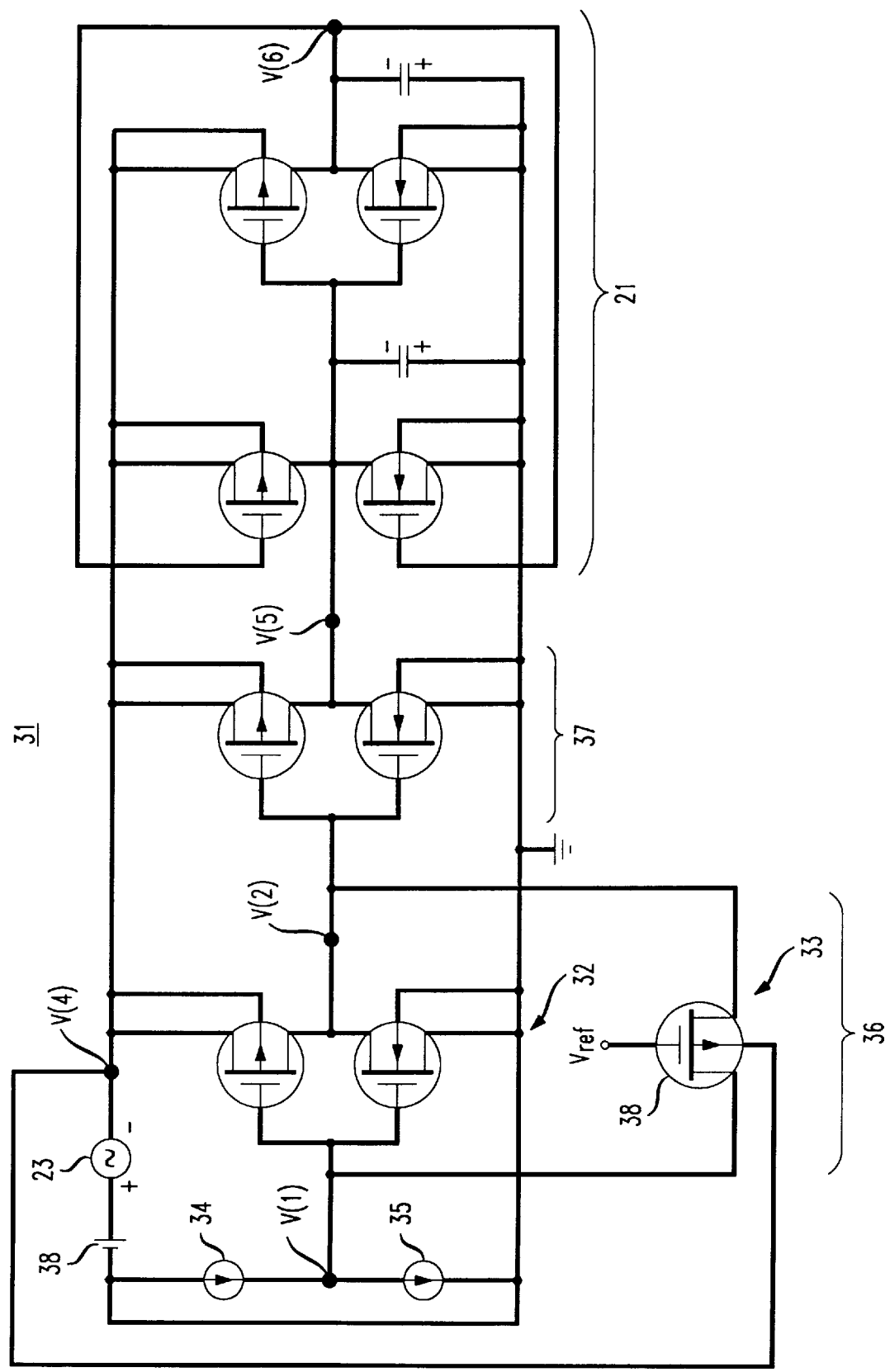
FIG. 3 is a schematic diagram of another embodiment of a triggered-transimpedance receiver in accordance with the present invention.

FIG. 3 depicts an alternate embodiment of the invention in the form of a double-ended (two-beam) transimpedance triggered receiver 31. In the FIG. 3 circuit, two photodetectors 34 and 35 are connected in series. One the two photodetectors or the other is always illuminated to produce the input voltage v(1) that represents a differential between the optical power falling on the two photodetectors 34 and 35. The receiver circuit 31 is biased at the midpoint of the switching threshold. Therefore, illuminating one of the photodetectors 34, 35 will produce a logic 'one' and illuminating the other of the two detectors 34, 35 will produce a logic 'zero'. That is, both logic points are defined by excursions away from the equilibrium bias point of the receiver 31.

The receiver 31 also includes a noise source or signal 23. A supply voltage 38 is located between the two series-connected photodetectors 34, 35 and a first stage amplifier 32. The voltage v(4) represents the total supply voltage including the noise signal 23. As in the circuit of FIG. 1, the supply voltage v(4) varies by an amount equal to the amplitude of the noise signal or voltage 23. A transimpedance amplifier 36 includes a first stage amplifier 32 to which the voltage v(1) is input and a transimpedance feedback stage 33. The transimpedance feedback stage 33, formed of a single PMOS transistor 38, connects the output v(2) of first stage amplifier 32 to the input voltage v(1) through the transistor 38 and biases the first stage amplifier 32 at the midpoint of the switching threshold and to provide stability to the output of first stage amplifier circuit 32. The output v(2) of the amplifier 32 is transmitted to a second stage amplifier 37 which amplifies the voltage v(2) to levels associated with or indicative of logic high and low states. Finally, the output v(5) of second stage amplifier 37 is input to the triggered circuit 21, as described above. The hysteresis of the triggered circuit 21 smooths out the voltage input thereto so that either a logic "1" voltage or a logic "0" voltage is output as voltage signal v(6).

The photodetectors 34 and 35 of the FIG. 3 embodiment are preferably pin photodiodes. More specifically, the photodetectors may be MQW pin photodiodes. Alternatively, photodetectors 34 and 35 may be any type of photoabsorptive material or other device that provides an electrical voltage output which varies in response to changes in incident light intensity.

Figures 5A, 5B, 5C, 5D:
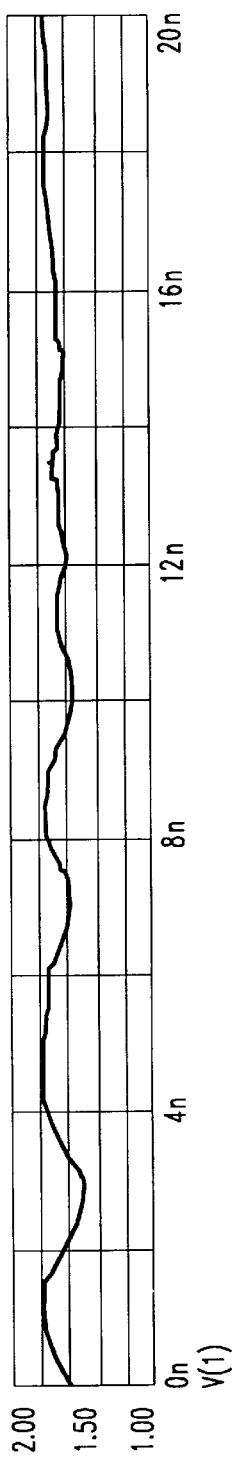
FIGS. 5a–d are a series of graphs showing different voltages from the circuit of FIG. 3 plotted along a timeline.

FIGS. 5a–d graphically depict data obtained from a simulation of the receiver circuit 31 of FIG. 3. The simulation was performed for a 0.5 μm CMOS, 3.3 Volt process, with a circuit operating speed of 622 Mbit/s and a peak current of 25 μm applied to the circuit input. FIG. 5a shows the input voltage v(1); because the noise voltage 23 is added to the supply voltage applied to the photodetector 34, the binary data in signal v(1) is barely discernible. FIG. 5b shows the voltage output v(2) from the transimpedance amplifier 32 of FIG. 3; this is seen to be more stabilized than the input voltage v(1). FIG. 5d, which plots voltage v(4), shows that the noise voltage from source 23 that is added to the supply voltage 38 has a peak-to-peak voltage swing of approximately 300 mV. The input voltage swing between the high and low band logic states is 200 mV, which is less than the disturbance voltage (i.e. noise voltage 23). Therefore, the simulation indicates that the circuit may be able to tolerate fluctuations of the supply voltage and/or ground lines that are greater than the input voltage swing at the front end. FIG. 5c shows the resulting output v(6) as clearly indicating a logic "1" or "0".

In each of the receiver circuits shown in FIGS. 2 and 3, the triggered circuit 21 is depicted by way of preferred example as a Schmitt-trigger. However, any type of trigger circuit which operatively exhibits a similar input/output voltage hysteresis characteristic and provides a like noise tolerance function as a Schmitt-trigger may alternatively be employed.

Each of the FIGS. 2 and 3 circuits also include a transimpedance amplifier as the first stage amplifier. Alternatively, the triggered circuit may be connected to a receiver that does not incorporate a transimpedance amplifier for providing increased noise tolerance to the non-transimpedance receivers. These and other modifications are within the intended scope and contemplation of the invention.

Thus, while there have been shown and described and pointed out fundamental novel features of the present invention as applied to preferred embodiments thereof, it will be understood that various omissions and substitutions and changes in the form and details of the devices illustrated, and in their operation, may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

I claim:

1. A triggered optical receiver circuit for receiving a variable optical signal and outputting an electrical signal, comprising:

a detector electrically operatively connected for receiving the variable optical signal and generating a variable output voltage in response to the optical signal;

a first stage amplifier signally connected for receiving the detector output voltage and generating an amplified output; and a trigger circuit having an input/output voltage characteristic comprising a hysteresis loop for receiving the amplified output and generating a variable electrical signal varying between a high and a low voltage signal pulse in accordance with the variable optical signal.

2. The receiver circuit of claim 1, wherein said detector comprises a first photodetector and a capacitor connected in series;

said photodetector being operatively positioned to receive the optical signal; and said output voltage of said detector being generated for output between said photodetector and said capacitor.

3. The receiver circuit of claim 2, wherein said photodetector comprises a pin photodiode.

4. The receiver circuit of claim 3, wherein said pin photodiode comprises a Multiple Quantum Well pin photodiode.

5. The receiver circuit of claim 2, wherein said photodetector comprises a Metal-Semiconductor-Metal photodetector.

6. The receiver circuit of claim 2, wherein said trigger circuit comprises a Schmitt trigger.

7. The receiver circuit of claim 2, wherein said first stage amplifier comprises a transimpedance amplifier.

8. The receiver circuit of claim 7, wherein said transimpedance amplifier comprises a complementary metal oxide semiconductor inverter having an input and an output and a transimpedance feedback loop connected between the inverter output and the inverter input.

9. The receiver circuit of claim 8, wherein said transimpedance loop comprises a transistor having a source connected to the inverter output, a drain connected to the inverter input and a gate connected to a reference voltage of the receiver circuit.

10. The receiver circuit of claim 9, wherein said transistor comprises a p-channel metal oxide semiconductor (PMOS).

11. The receiver circuit of claim 7, wherein said transimpedance loop comprises a pair of transistors connected in parallel and having sources connected to the inverter output, drains connected to the inverter input, and a gate of one of said pair of transistors connected to a reference voltage of the receiver circuit and a gate of another of said pair of transistors connected to the inverter input.

12. The receiver circuit of claim 11, wherein said one of said pair of transistors comprises an n-channel metal oxide semiconductor (NMOS) device and said another of said pair of transistors comprises a PMOS device.

13. The receiver circuit of claim 1, wherein said detector comprises first and second photodetectors connected in series.

14. The receiver circuit of claim 13, wherein said first and second photodetectors comprise pin photodiodes.

15. The receiver circuit of claim 14, wherein said pin photodiodes comprise Multiple Quantum Well photodiodes.

16. The receiver circuit of claim 13, wherein said first and second photodetectors comprise Metal-Semiconductor-Metal photodetectors.

17. The receiver circuit of claim 1, wherein said detector comprises a first and a second photodetector connected in series;

said first photodetector being operatively positioned to receive said optical signal and generate a voltage that varies in response to an analog intensity level of said optical signal; and said second photodetector receiving a constant light signal for supplying a substantially constant bias voltage to said detector; and said output voltage of said detector being generated for output between said first and second photodetectors.

18. The receiver circuit of claim 17, wherein said first and second photodetectors comprise pin diodes.

19. The receiver circuit of claim 18, wherein said pin photodiodes comprise Multiple Quantum Well photodiodes.

20. The receiver circuit of claim 17, wherein said first and second photodetectors comprise Metal-Semiconductor-Metal photodetectors.

21. The receiver circuit of claim 17, wherein said trigger circuit comprises a Schmitt trigger.

22. The receiver circuit of claim 17, wherein said first stage amplifier comprises a transimpedance amplifier.

23. The receiver circuit of claim 22, wherein said transimpedance amplifier comprises a complementary metal oxide semiconductor inverter having an input and an output and a transimpedance feedback loop connected between the inverter output and the inverter input.

24. The receiver circuit of claim 23, wherein said transimpedance loop comprises a transistor having a source connected to the inverter output, a drain connected to the inverter input and a gate connected to a reference voltage of the receiver circuit.

25. The receiver circuit of claim 24, wherein said transistor comprises a p-channel metal oxide semiconductor (PMOS).

26. The receiver circuit of claim 22, wherein said transimpedance loop comprises a pair of transistors connected in parallel and having sources connected to the inverter output, drains connected to the inverter input, and a gate of one of said pair of transistors connected to a reference voltage of the receiver circuit and a gate of another of said pair of transistors connected to the inverter input.

27. The receiver circuit of claim 26, wherein said one of said pair of transistors comprises an NMOS device and said another of said pair of transistors comprises a PMOS device.

28. The receiver circuit of claim 1, wherein said trigger circuit comprises a Schmitt trigger.

* * * * *